(12) United States Patent
Bartley et al.

(10) Patent No.: US 7,492,662 B2
(45) Date of Patent: Feb. 17, 2009

(54) STRUCTURE AND METHOD OF IMPLEMENTING POWER SAVINGS DURING ADDRESSING OF DRAM ARCHITECTURES

(75) Inventors: Gerald K. Bartley, Rochester, MI (US); Darryl J. Becker, Rochester, MI (US); John M. Borkenhagen, Rochester, MI (US); Philip R. Germann, Oronoco, MI (US); William P. Hovis, Rochester, MI (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 11/688,897

(22) Filed: Mar. 21, 2007

(65) Prior Publication Data

US 2008/0232185 A1  Sep. 25, 2008

(51) Int. Cl.
*G11C 8/00* (2006.01)
(52) U.S. Cl. .............................. 365/230.06; 365/230.03
(58) Field of Classification Search ............ 365/230.06, 365/230.03, 230.08
See application file for complete search history.

(56) References Cited

U.S. PATENT DOCUMENTS

| 5,546,353 | A | * | 8/1996 | Phillips et al. | 365/230.06 |
| 6,295,595 | B1 | * | 9/2001 | Wildenberg et al. | 711/211 |
| 2006/0047493 | A1 | | 3/2006 | Gooding | |
| 2007/0247897 | A1 | * | 10/2007 | Katti | 365/158 |

* cited by examiner

*Primary Examiner*—Anh Phung
(74) *Attorney, Agent, or Firm*—Cantor Colburn LLP

(57) ABSTRACT

A random access memory device includes an array of individual memory cells arranged into rows and columns, each memory cell having an access device associated therewith. Each row of the array further includes a plurality of N word lines associated therewith, with a wherein N corresponds to a number of independently accessible partitions of the array, wherein each access device in a given row is coupled to only one of the N word lines of the row. Address decoder logic in signal communication with the array is configured to receive a plurality of row address bits and determine, for a requested row identified by the row address bits, which of the N partitions within the requested row are to be accessed, such that access devices within a selected row, but not within a partition to be accessed, are not activated.

19 Claims, 4 Drawing Sheets

US 7,492,662 B2

STRUCTURE AND METHOD OF IMPLEMENTING POWER SAVINGS DURING ADDRESSING OF DRAM ARCHITECTURES

BACKGROUND

The present invention relates generally to memory storage devices and, more particularly, to a structure and method of implementing power savings during addressing of Dynamic Random Access Memory (DRAM) devices.

DRAM integrated circuit arrays have been existence for several years, with their dramatic increase in storage capacity having been achieved through advances in semiconductor fabrication technology and circuit design technology. Considerable advances in these two technologies have also resulted in higher and higher levels of integration that permit dramatic reductions in memory array size and cost, as well as increased process yield.

A DRAM memory cell typically includes, as basic components, an access transistor (switch) and a capacitor for storing a binary data bit in the form of a charge. Typically, a first voltage is stored on the capacitor to represent a logic HIGH or binary "1" value (e.g., $V_{DD}$), while a second voltage on the storage capacitor represents a logic LOW or binary "0" value (e.g., ground). A basic drawback of a DRAM device is that the charge on the capacitor eventually leaks away and therefore provisions must be made to "refresh" the capacitor charge, otherwise the data bit stored by the memory cell is lost.

As power demands increase in computer systems, new ways to save power are constantly in demand. Recent studies have shown that in a memory cache, up to 95% of all memory access can occur in only 25% of the cache. This results in a large number of memory devices that are constantly "at the ready," and thus drawing power. In present DRAM architectures, it is generally desirable from a performance standpoint to have deep (large) page accesses for certain types of applications. However, addressing large page sizes can result in row address commands applied to many devices within the DRAM array, which is a large consumer of active power in a memory system. FIG. 1 depicts an exemplary DRAM architecture 100, which illustrates that the activation of row devices results in a relatively large consumption of power.

In the simplified example shown, the DRAM architecture 100 of FIG. 1 is an array of 4 by 4 cells 102, each including one storage capacitor 104 and one access transistor 106 (however, modern DRAM devices may be thousands of cells in length/width). During a read operation, the row of the selected cell is activated, turning on each of the transistors coupled to the word line 108 of the row and connecting the capacitors of that row to the associated sense lines 110. The sense lines 110 are in turn (selectively) coupled to sense amplifiers 112, which distinguish and latch signals that represent a stored 0 or 1. The amplified value from the appropriate column is then selected and connected to the output. At the end of a read cycle, the row values are restored to the capacitors 104, which were discharged during the read. A write operation is implemented by activating the row and connecting the data values to be written to the sense lines 110, which charges the cell capacitors 104 to the desired values. During a write to a particular cell, the entire row is read out, one value changed, and then the entire row is written back in.

In some applications, it is possible to "step" the accesses through a row, effectively optimizing the power that was spent in activating the entire row. However, in many applications, the random nature of accesses can offset the benefits of page depth, as the system never uses the large page accesses, or is not able to "step" through enough columns to make up for the number of row devices which were initially powered. Thus, methods for reducing the power related to actively addressing data in a memory system are generally desirable.

One approach to reducing power consumption relates to placing DRAMs into a "degrade" mode, wherein the DRAM enters a deactivated, stand-by state. Additional information in this regard may be found in U.S. patent application publication U.S. 2006/0047493 by Gooding. In particular, the '493 publication introduces the use of deep power down modes of real memory portions within a plurality of volatile real memory portions without loss of data.

In view of the above, it would be desirable to be able to continue to allow access to the DRAM while also conserving power, and in a manner that does not result in additional time taken to bring the DRAM out of a dormant stand-by mode.

SUMMARY

The foregoing discussed drawbacks and deficiencies of the prior art are overcome or alleviated, in an exemplary embodiment, by a random access memory device including an array of individual memory cells arranged into rows and columns, each memory cell having an access device associated therewith; each row of the array further including a plurality of N word lines associated therewith, with a wherein N corresponds to a number of independently accessible partitions of the array, wherein each access device in a given row is coupled to only one of the N word lines of the row; and address decoder logic in signal communication with the array, the address decoder logic configured to receive a plurality of row address bits and determine, for a requested row identified by the row address bits, which of the N partitions within the requested row are to be accessed, such that access devices within a selected row, but not within a partition to be accessed, are not activated.

In another embodiment, a method of reducing power consumption of a random access memory device includes receiving a requested address for a memory array, the memory array comprising individual memory cells arranged into rows and columns, with each memory cell having an access device associated therewith; each row of the array further including a plurality of N word lines associated therewith, with a wherein N corresponds to a number of independently accessible partitions of the array, wherein each access device in a given row is coupled to only one of the N word lines of the row; and determining, for a requested row that is identified by a plurality of row address bits included within the requested address, which of the N partitions within the requested row are to be accessed; and activating one or more of the N word lines of the requested row in a manner so as to activate only the access devices corresponding to one or more of the N partitions to be accessed; wherein any access devices corresponding to one or more of the N partitions not to be accessed are not activated.

In still another embodiment, a computing system includes a processor; a memory controller executable by the processor, the memory controller in communication with a random access memory device having an array of individual memory cells arranged into rows and columns, each memory cell having an access device associated therewith; each row of the array further including a plurality of N word lines associated therewith, with a wherein N corresponds to a number of independently accessible partitions of the array, wherein each access device in a given row is coupled to only one of the N word lines of the row; and address decoder logic in signal communication with the array, the address decoder logic configured to receive a plurality of row address bits and determine, for a requested row identified by the row address bits, which of the N partitions within the requested row are to be accessed, such that access devices within a selected row, but not within a partition to be accessed, are not activated.

BRIEF DESCRIPTION OF THE DRAWINGS

Referring to the exemplary drawings wherein like elements are numbered alike in the several Figures.

DETAILED DESCRIPTION

Disclosed herein is a structure and method of implementing power savings during addressing of DRAM devices. Briefly stated, a DRAM array is divided, through multiple word lines per row, into a plurality of partitions such that power is saved for those applications that do not need to use a full complement of addressing (or page depth) associated with conventional server architectures. Moreover, this reduction in power does not come at a cost of reducing the total memory available. Rather, all addresses remain valid and able to contain data in a self-refresh operation, while the number of partitions that may be accessed at a time is reduced during a power saving mode. In order to individually address specific row partitions, supporting control logic is used to decode, select and address each partition individually. As described in fuller detail herein after, the supporting control logic may be integrated within a separate memory controller, as stand-alone logic, or embedded on the DRAM.

Figure 1:
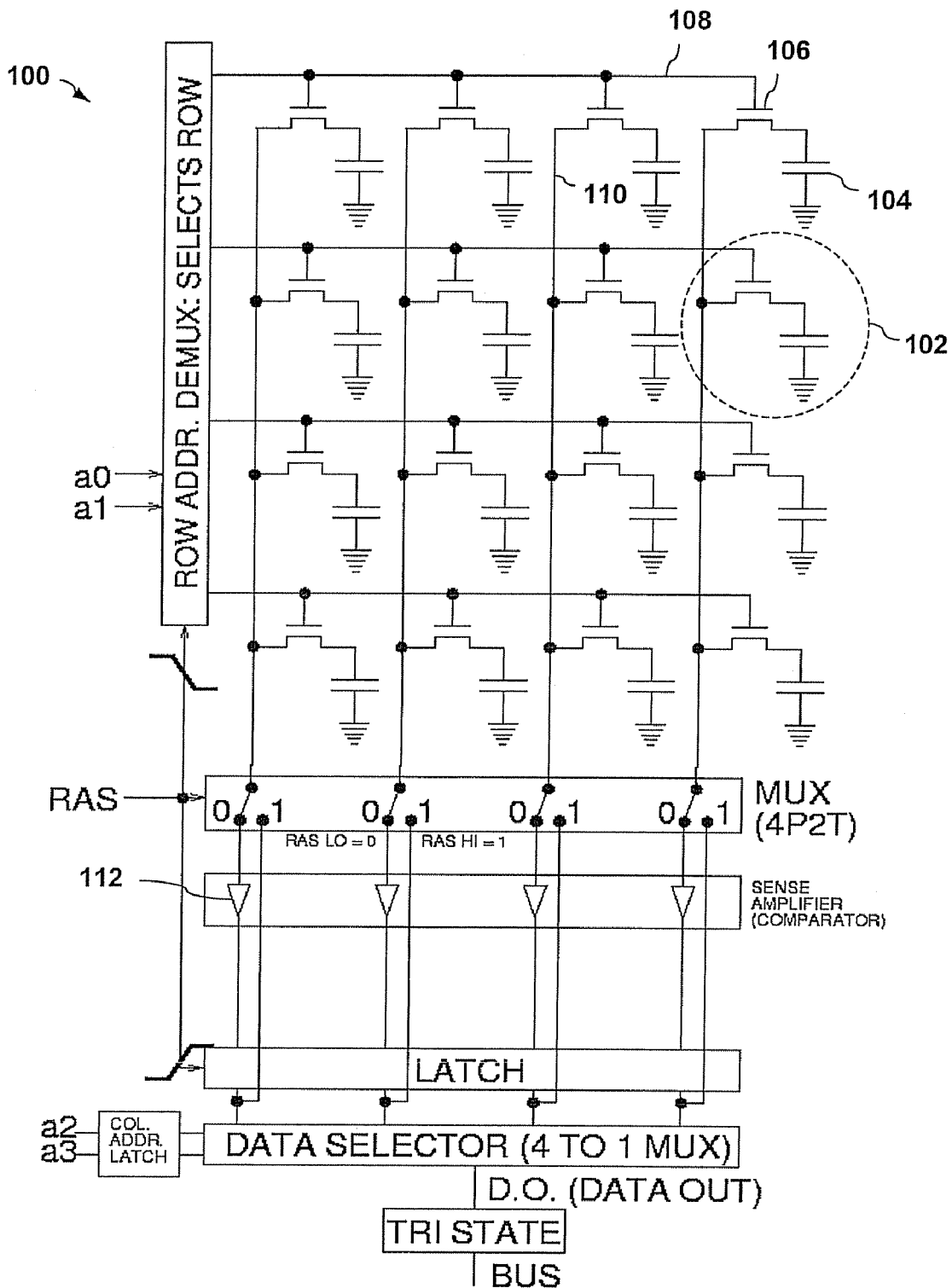
FIG. 1 is a schematic diagram of an exemplary DRAM architecture.
Figure 2:
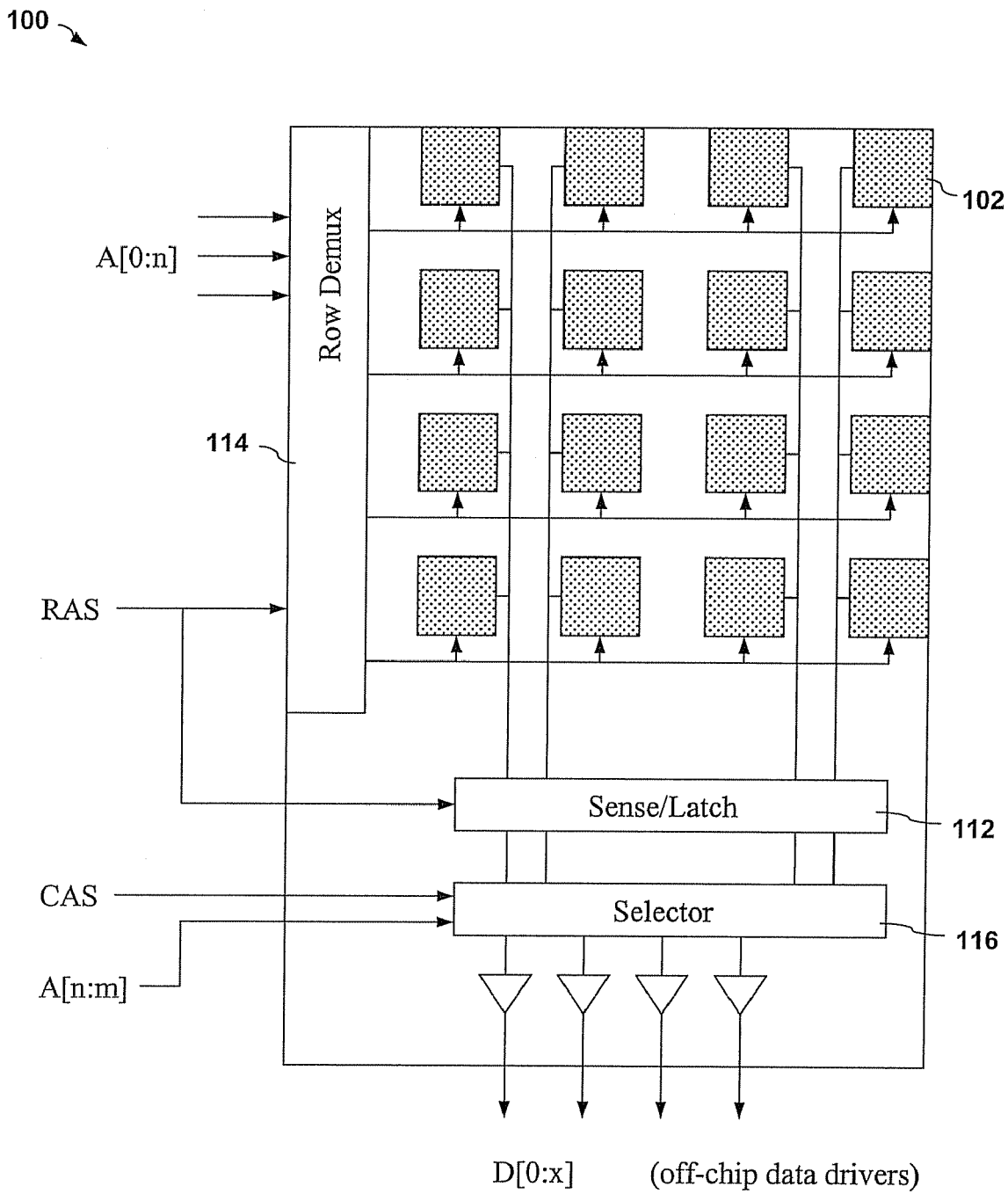
FIG. 2 is another schematic diagram of the existing DRAM architecture of FIG. 1, which particularly illustrates a conventional row-select operation.

Referring now to FIG. 2, there is shown another schematic diagram of the existing DRAM architecture 100, which illustrates a conventional row-select operation. When the row address strobe (RAS) signal is active, the address presented at the group of row address bits A[0:n] is translated into a row location within the array. Upon decoding by the row demultiplexer "Row Demux" circuitry 114 of the array, each of the access transistors of the selected row is turned on (resulting in the portion of the operation that consumes the most power). Then, the column of interest is selected. When the column address strobe (CAS) signal is active, the address presented at the group of column address bits A[n:m] is translated into a column location within the array through selector circuitry 116, and the data is read out on the data lines D[0:x].

As indicated above, however, even during those operations where the entire width of the array need not be accessed, an entire row of access devices will still be operated under the conventional row architecture. Therefore, in accordance with an embodiment of the invention, a DRAM architecture is presented herein in which the array is provided with the capability of accessing fractional partitions of the addresses of a DRAM chip whenever the architecture dictates that it is not necessary to utilize larger data sets. For example, by partitioning the row access commands (which are a large portion of active power when addressing a DRAM), the device may allow access to (for example) only ½ of the row partitions as previously accessed in current architectures, thereby saving ½ of the row-access power during that operation. However, further fractional partitions could also be implemented (e.g., ⅓, ¼, ⅕, etc.).

Figure 3:
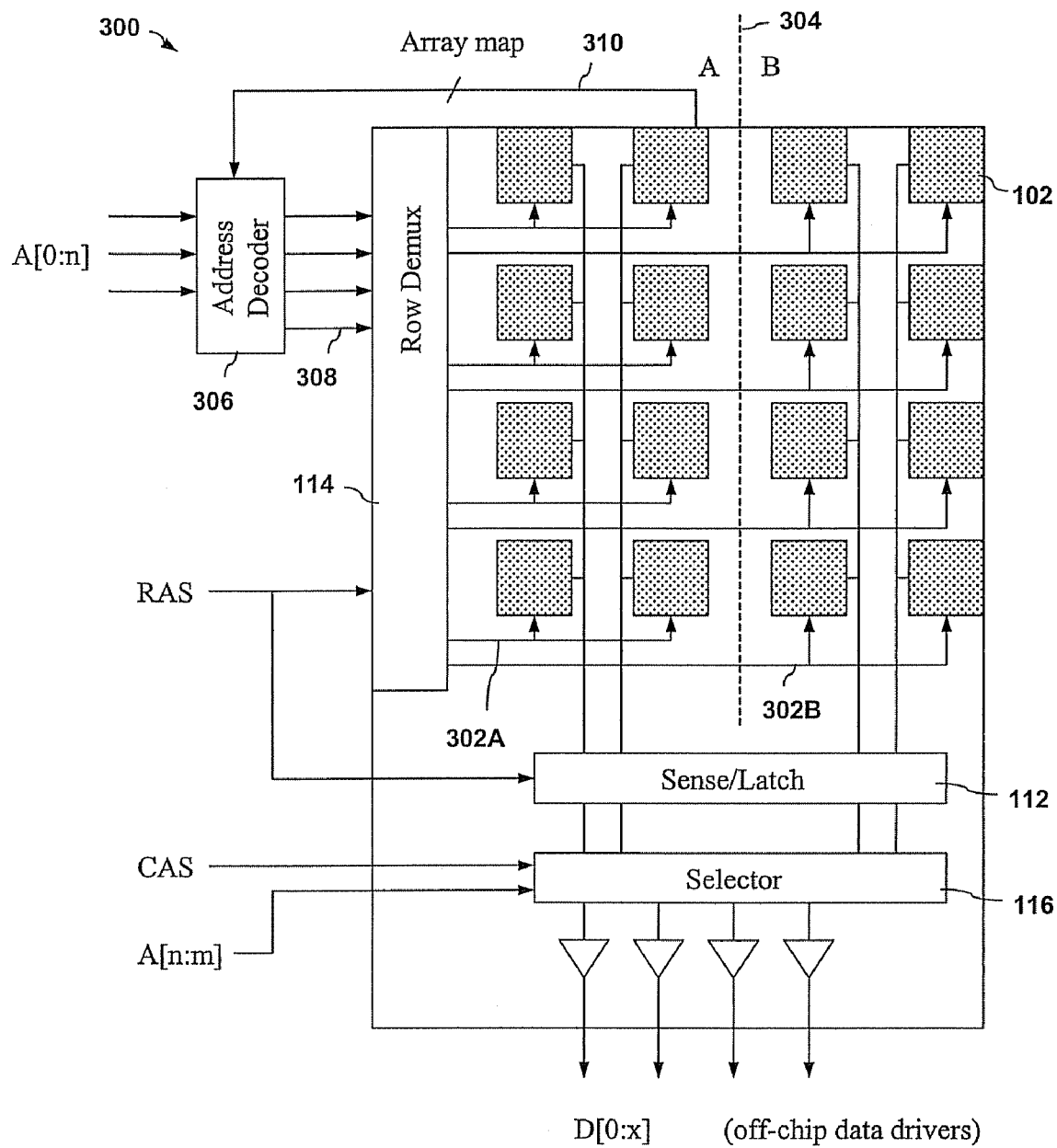
FIG. 3 is a schematic diagram of a DRAM architecture implementing row partitioning, in accordance with an embodiment of the invention.

FIG. 3 is a schematic diagram of a DRAM architecture 300 implementing row partitioning, in accordance with an embodiment of the invention. As will be noted, each row of the array includes a pair of word lines (row select lines) 302A, 302B, which effectively divide the array into a pair of row partitions A, B, on either side of the dashed line 304. Again, in the simple example illustrated there are two partitions and hence two word lines per row. The cells of the leftmost columns of the array are coupled to the associated one of the word lines 302A, while cells of the rightmost columns of the array are coupled to the associated one of the word lines 302B. However, for a different number, N, of partitions there would be n-word lines per row. It should be further appreciated that the number of cells in a given row need not be equally apportioned among the number, N, of partitions. For example, in a 256 column device, partition A could include 192 cells coupled to word line 302A, while partition B could include the remaining 64 cells word line 302B.

In order to be able to independently select a given one (or both) of the word lines 302A, 302B of a particular row, address decoder logic 306 is configured to receive the row address bits A[0:n] and determine which row to activate. The address decoder logic 306 uses a map 310 of the array to further determine which of the row partitions (e.g., A, B or both) to activate. Depending upon how many partitions are incorporated in to the array, the address decoder logic 306 provides at least one additional signal 308 to the row demux circuitry 114, further specifying which partition(s) are to be activated. In one embodiment, the address decoder logic 306 may be incorporated into the row demux circuitry 114 on the DRAM or, alternatively, with a memory controller (not shown in FIG. 3) itself. As a result of the partitioning, a power savings is realized whenever less than the total number of access devices in a row is activated, as well as by having fewer devices overall in the sense/latch circuitry 112 and column select circuitry 116.

Figure 4:
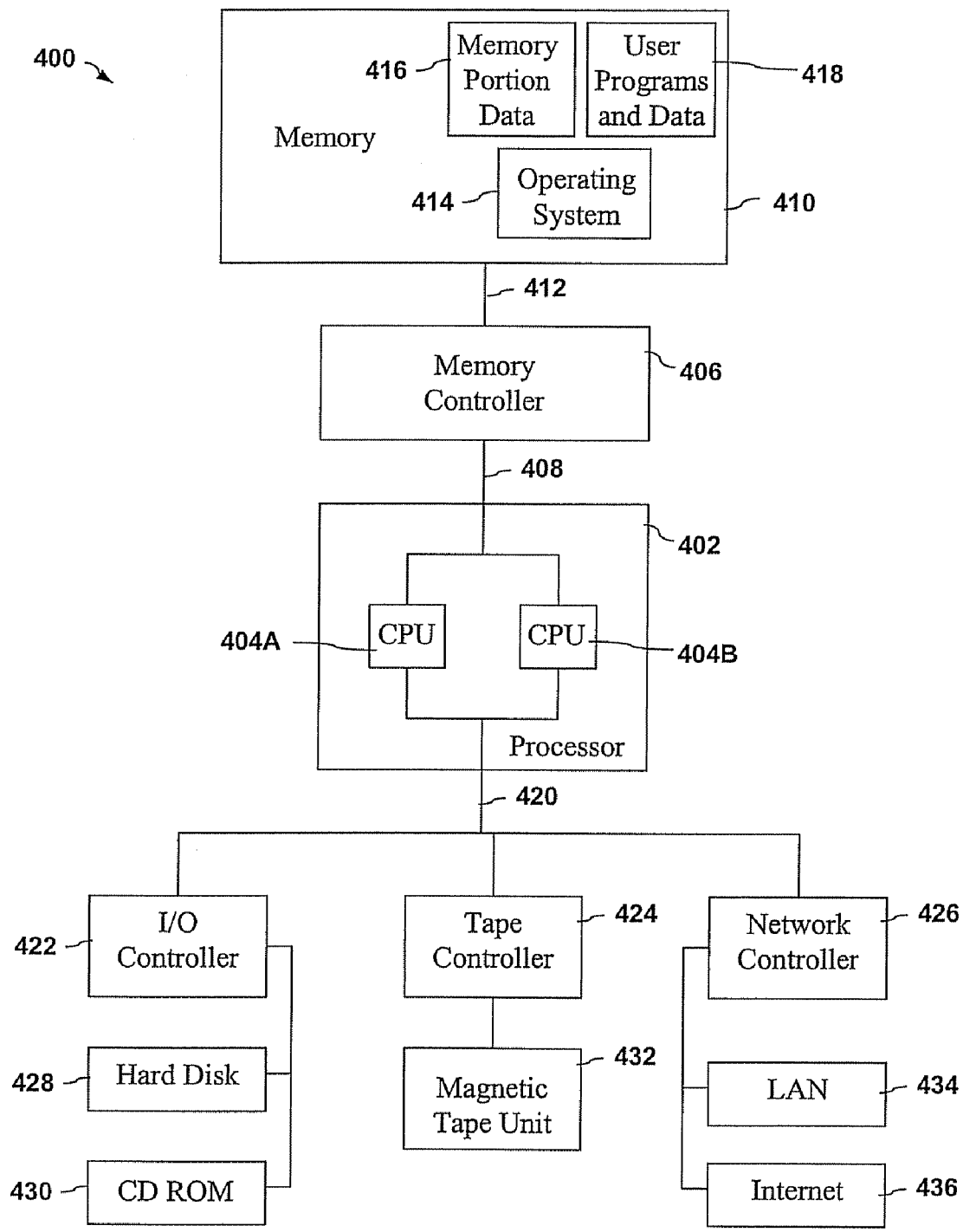
FIG. 4 is a block diagram of an exemplary computing system suitable for use in accordance with the reduced power DRAM architecture of FIG. 3.

Finally, FIG. 4 is a block diagram of an exemplary computing system 400 suitable for use in accordance with the reduced power DRAM architecture of FIG. 3. The exemplary computing system 400 includes a processor 402, which may further comprise multiple CPUs (central processing units) 404A, 404B. The processor 402 is coupled to a memory controller 406 by a first bus 408. The memory controller 406 performs functions such as fetch and store operations, maintains cache coherency, and keeps track of where pages of memory are stored in real memory. In addition, memory 410 is coupled to the memory controller 406 by a second bus 412.

As is also shown in FIG. 4, the memory 410 further includes an operating system 414, a memory portion data 416, and user programs and data 418. In the exemplary embodiment illustrated, memory 410 is constructed of real memory portions, such as cards containing memory chips (e.g., DRAM chips), or DIMMs (dual inline memory modules), or any other suitable unit of memory. For example, a computing system might have a memory 410 made up of four 128 MB DIMMs. Memory portion data 416 contains information about real memory portions implemented in memory 410.

Within the exemplary computing system 400, processor 402 is coupled by a third bus 420 to various I/O devices, including, but not limited to, an I/O controller 422, a tape controller 424, and a network controller 426. The I/O controller 422 is coupled to a hard disk 428 (which could be an entire hard disk subsystem), and a CD ROM 430. Other I/O devices, such as DVDs (not shown) are also contemplated. In the illustrated embodiment, the tape controller 424 is further coupled to a magnetic tape unit 432, and in an alternative embodiment could include an entire magnetic tape subsystem, having any number of physical magnetic tape drives. In addition, the network controller 426 is coupled to a LAN (Local Area Network) 434 and an Internet connection 436. It will be understood that there are a large number of ways to configure a computing system, and computing system 400 is shown for illustrative purposes only.

As indicated above, the supporting control logic 306 depicted in FIG. 3 may be integrated within the memory controller 406, as stand-alone logic, or embedded in the memory device 410. For example, the memory controller 406 could be designed to utilize the address partitions by architecting the total possible number of addresses for a partitioned memory. Then, the memory controller 406 can adapt to the partitions on a "per-application" basis. For applications that require deep page depth, the partitions will be disabled (in that all word lines of a selected row would be activated), and full row accesses could occur. For other applications that do not require large page depth (more random accesses), the partitions would be enabled, allowing power savings during accesses. In the partitioned state, all data remains available for normal access. The remaining partitions are available as needed, but may require a longer access time.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A random access memory device, comprising:
    an array of individual memory cells arranged into rows and columns, each memory cell having an access device associated therewith;
    each row of the array further including a plurality of N word lines associated therewith, with a wherein N corresponds to a number of independently accessible partitions of the array, wherein each access device in a given row is coupled to only one of the N word lines of the row; and
    address decoder logic in signal communication with the array, the address decoder logic configured to receive a plurality of row address bits and determine, for a requested row identified by the row address bits, which of the N partitions within the requested row are to be accessed, such that access devices within a selected row, but not within a partition to be accessed, are not activated.

2. The memory device of claim 1, wherein the array of individual memory cells comprises dynamic random access memory (DRAM) cells.

3. The memory device of claim 1, wherein the address decoder logic utilizes an array map to determine which of the N partitions within the requested row are to be accessed.

4. The memory device of claim 1, wherein the address decoder logic is configured to pass the plurality of row address bits through to row demultiplexer circuitry associated with the word lines, and wherein the address decoder logic is further configure to communicate at least one additional signal to the row demultiplexer circuitry, the at least one additional signal indicative of which of the N partitions within the requested row are to be accessed.

5. The memory device of claim 4, wherein the address decoder logic is embedded within circuitry of the array.

6. The memory device of claim 4, wherein the address decoder logic resides within a discrete memory controller with respect to the array.

7. A method of reducing power consumption of a random access memory device, the method comprising:
    receiving a requested address for a memory array, the memory array comprising individual memory cells arranged into rows and columns, with each memory cell having an access device associated therewith; each row of the array further including a plurality of N word lines associated therewith, with a wherein N corresponds to a number of independently accessible partitions of the array, wherein each access device in a given row is coupled to only one of the N word lines of the row; and
    determining, for a requested row that is identified by a plurality of row address bits included within the requested address, which of the N partitions within the requested row are to be accessed; and
    activating one or more of the N word lines of the requested row in a manner so as to activate only the access devices corresponding to one or more of the N partitions to be accessed;
    wherein any access devices corresponding to one or more of the N partitions not to be accessed are not activated.

8. The method of claim 7, wherein the determination of which of the N partitions within the requested row are to be accessed is implemented through address decoder logic in signal communication with the array, with the address decoder logic configured to receive the plurality of row address bits.

9. The method of claim 7, wherein the array of individual memory cells comprises dynamic random access memory (DRAM) cells.

10. The method of claim 8, wherein the address decoder logic utilizes an array map to determine which of the N partitions within the requested row are to be accessed.

11. The method of claim 8, wherein the address decoder logic is configured to pass the plurality of row address bits through to row demultiplexer circuitry associated with the word lines, and wherein the address decoder logic is further configure to communicate at least one additional signal to the row demultiplexer circuitry, the at least one additional signal indicative of which of the N partitions within the requested row are to be accessed.

12. The method of claim 8, wherein the address decoder logic is embedded within circuitry of the array.

13. The method of claim 8, wherein the address decoder logic resides within a discrete memory controller with respect to the array.

14. A computing system, comprising:
    a processor;
    a memory controller executable by the processor, the memory controller in communication with a random access memory device having an array of individual memory cells arranged into rows and columns, each memory cell having an access device associated therewith;
    each row of the array further including a plurality of N word lines associated therewith, with a wherein N corresponds to a number of independently accessible partitions of the array, wherein each access device in a given row is coupled to only one of the N word lines of the row; and address decoder logic in signal communication with the array, the address decoder logic configured to receive a plurality of row address bits and determine, for a requested row identified by the row address bits, which of the N partitions within the requested row are to be accessed, such that access devices within a selected row, but not within a partition to be accessed, are not activated.

15. The system of claim 14, wherein the array of individual memory cells comprises dynamic random access memory (DRAM) cells.

16. The system of claim 14, wherein the address decoder logic utilizes an array map to determine which of the N partitions within the requested row are to be accessed.

17. The system of claim 14, wherein the address decoder logic is configured to pass the plurality of row address bits through to row demultiplexer circuitry associated with the word lines, and wherein the address decoder logic is further configure to communicate at least one additional signal to the row demultiplexer circuitry, the at least one additional signal indicative of which of the N partitions within the requested row are to be accessed.

18. The system of claim 17, wherein the address decoder logic is embedded within circuitry of the random access memory device.

19. The system of claim 17, wherein the address decoder logic resides within the memory controller with respect to the array.

* * * * *